United States Patent
Kawanami et al.

(10) Patent No.: US 9,018,597 B2
(45) Date of Patent: Apr. 28, 2015

(54) GAS FIELD IONIZATION ION SOURCE AND ION BEAM APPARATUS

(71) Applicant: Hitachi High-Technologies Corporation, Minato-ku, Tokyo (JP)

(72) Inventors: Yoshimi Kawanami, Tokyo (JP); Hironori Moritani, Tokyo (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 14/390,071

(22) PCT Filed: Mar. 11, 2013

(86) PCT No.: PCT/JP2013/056557
§ 371 (c)(1),
(2) Date: Oct. 2, 2014

(87) PCT Pub. No.: WO2013/150861
PCT Pub. Date: Oct. 10, 2013

(65) Prior Publication Data
US 2015/0041650 A1    Feb. 12, 2015

(30) Foreign Application Priority Data

Apr. 3, 2012   (JP) ................................ 2012-084425

(51) Int. Cl.
H01J 27/26    (2006.01)
H01J 37/08    (2006.01)
(Continued)

(52) U.S. Cl.
CPC ............. *H01J 37/08* (2013.01); *H01J 37/10* (2013.01); *H01J 37/147* (2013.01); *H01J 37/26* (2013.01); *H01J 2237/0807* (2013.01)

(58) Field of Classification Search
USPC .......................................... 250/423 F, 423 R
See application file for complete search history.

(56) References Cited

U.S. PATENT DOCUMENTS 8,115,184 B2 *   2/2012   Shichi et al. ............. 250/492.21
2009/0200484 A1   8/2009   Frosien
(Continued)

FOREIGN PATENT DOCUMENTS

JP    58-89763    5/1983
JP    2-87454     3/1990
(Continued)

OTHER PUBLICATIONS

International Search Report (PCT/ISA/210) dated Jun. 25, 2013, with English translation (ten pages).

*Primary Examiner* — Kiet T Nguyen
(74) *Attorney, Agent, or Firm* — Crowell & Moring LLP

(57) ABSTRACT

In the case of a conventional gas field ionization ion source, it was not possible to carry out an analysis with a high S/N ratio and a high-speed machining process because the current amount of an ion beam is small. In view of these problems, the present invention has been devised, and its object is to obtain a large ion beam current, while suppressing a probability of damaging an emitter electrode. The present invention is characterized by a process in which an ion beam is emitted at least in two operation states including a first operation state in which, when a first extraction voltage is applied, with the gas pressure being set to a first gas pressure, ions are emitted from a first ion emission region at the apex of the emitter electrode, and a second operation state in which, when a second extraction voltage that is higher than the first extraction voltage is applied, with the gas pressure being set to a second gas pressure that is higher than the first gas pressure, ions are emitted from a second ion emission region that is larger than the first ion emission region.

6 Claims, 5 Drawing Sheets

(51) Int. Cl.
*H01J 37/10* (2006.01)
*H01J 37/147* (2006.01)
*H01J 37/26* (2006.01)

(56) References Cited

U.S. PATENT DOCUMENTS

| | | |
|---|---|---|
| 2012/0199758 A1 | 8/2012 | Kawanami et al. |
| 2013/0119252 A1 | 5/2013 | Kawanami et al. |
| 2013/0126731 A1 | 5/2013 | Shichi et al. |
| 2013/0264496 A1* | 10/2013 | Arai .............................. 250/489 |
| 2014/0191128 A1* | 7/2014 | Kawanami et al. ........... 250/309 |

FOREIGN PATENT DOCUMENTS

| | | |
|---|---|---|
| JP | 7-192669 | 7/1995 |
| JP | 7-272652 | 10/1995 |
| JP | 2009-187950 | 8/2009 |
| JP | 2009-218229 | 9/2009 |
| JP | 2011-82056 | 4/2011 |
| WO | WO 2011/046116 | 4/2011 |
| WO | WO 2011/096227 A1 | 8/2011 |
| WO | WO 2012/017789 A1 | 2/2012 |

* cited by examiner

GAS FIELD IONIZATION ION SOURCE AND ION BEAM APPARATUS

TECHNICAL FIELD

The present invention relates to a gas field ionization ion source and an ion beam apparatus using the same.

BACKGROUND ART

Patent Document 1 has disclosed a gas field ionization ion source (Gas Field Ion Source, abbreviated name: GFIS) having high luminance, which is provided with a micro-protrusion on an apex of an emitter electrode. Also disclosed is a focused ion beam (abbreviated name: FIB) apparatus in which this is installed so as to form a beam of gas ions of hydrogen ($H_2$), helium (He), neon (Ne) and the like.

Different from a gallium (Ga: metal) focused ion beam apparatus (abbreviated name: Ga-FIB) derived from a liquid metal ion source (abbreviated name: LMIS) that has been often used currently, this gas focused ion beam apparatus (abbreviated name: gas FIB) has an advantage that no Ga contamination is caused onto a sample. In addition, since the GFIS has a narrow energy width of gas ions extracted therefrom and since the size of the ion generation source is small, a finer beam can be formed in comparison with that of the Ga-FIB.

This gas FIB apparatus is used as a scanning ion microscope having high resolution. In other words, the apparatus forms an image of a sample by detecting secondary particles that are emitted from the sample in synchronism with a scanning process of ions on the sample.

Patent Document 2 has disclosed a method for adjusting an extraction voltage and a gas pressure upon forming an apex structure of an emitter electrode in the GFIS.

Patent Document 3 has disclosed a method in which a supply gas and an extraction voltage are switched so as to switch the kinds of emission ions in the GFIS.

CITATION LIST

Patent Documents

Patent Document 1: Japanese Patent Application Laid-Open Publication No. 7-192669
Patent Document 2: Japanese Patent Application Laid-Open Publication No. 7-272652
Patent Document 3: Japanese Patent Application Laid-Open Publication No. 2009-187950 (US 2009/0200484)

SUMMARY

Problems to be Solved by the Invention

Although the scanning ion microscope using the gas field ionization ion source makes it possible to observe a micro region with high resolution without contaminating a sample, the microscope newly requires a means for use in increasing an ion beam current on the sample when an attempt is made to carry out a high SNR (Signal to Noise Ratio) analysis and a high-speed process on the sample. As the maximum value of this ion beam current, about several 10 to 100 nA, which are used in the Ga-FIB, are desired. However, in a conventional gas field ionization ion source, since the total ion emission current from the apex of the emitter electrode is as small as several nA or less, it fails to satisfy the above-mentioned demand.

In this case, the gas field ionization ion source is used in a region in which an ion emission current from the apex of the emitter electrode causes a saturation relative to an increase of an extraction voltage, and the ion emission current at the time of saturation is limited by a gas pressure supplied to the vicinity of the emitter electrode. For this reason, a method is proposed in which the electric current is increased by simply increasing the pressure of the supply gas. However, this method causes an impurity gas contained in the supply gas to adsorb to the emitter electrode to easily cause electric field evaporation of the electrode material, with the result that the apex structure of the emitter electrode is damaged in a short period of time. Therefore, after the ion emission current has been increased by this method, the apex structure of the emitter electrode needs to be regenerated each time, making it difficult to frequently change the amount of the ion beam current.

In view of these problems, the present invention has been devised, and its object is to obtain a great ion beam current, while suppressing the probability of damaging the emitter electrode.

Means for Solving the Problems

In order to solve the above-mentioned problems, a gas field ionization ion source and an ion beam apparatus of the present invention are characterized by emitting an ion beam with at least two operation states including a first operation state in which when a first extraction voltage is applied, with the pressure of an ionization gas being set to a first gas pressure, ions are emitted from a first ion emission region on an apex of an emitter electrode, and a second operation state in which when a second extraction voltage that is higher than the first extraction voltage is applied, with the pressure of the gas being set to a second gas pressure that is higher than the first gas pressure, ions are emitted from a second ion emission region larger than the first ion emission region.

Effects of the Invention

In accordance with the present invention, since a greater ion beam current can be obtained while suppressing the probability of damaging the emitter electrode, it becomes possible to observe a micro region of a sample in a stable manner and also to carry out a high SNR analysis and a high-speed process.

BRIEF DESCRIPTIONS OF THE DRAWINGS

Figure 4A:
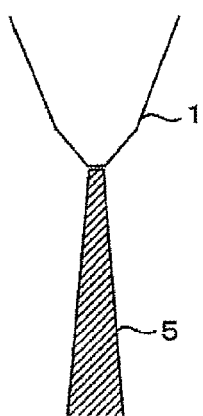
Figure 4B:
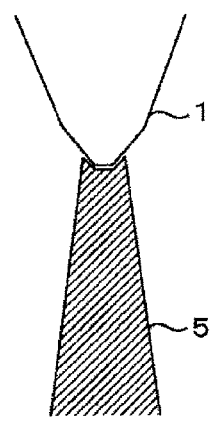
Figure 4C:
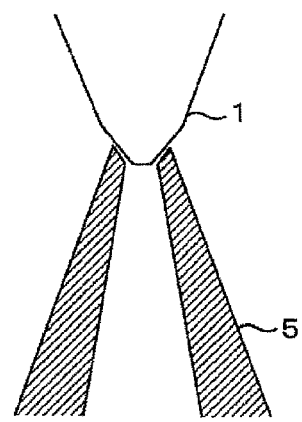
Figure 4D:
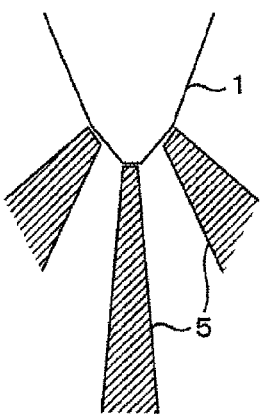
Figure 5A:
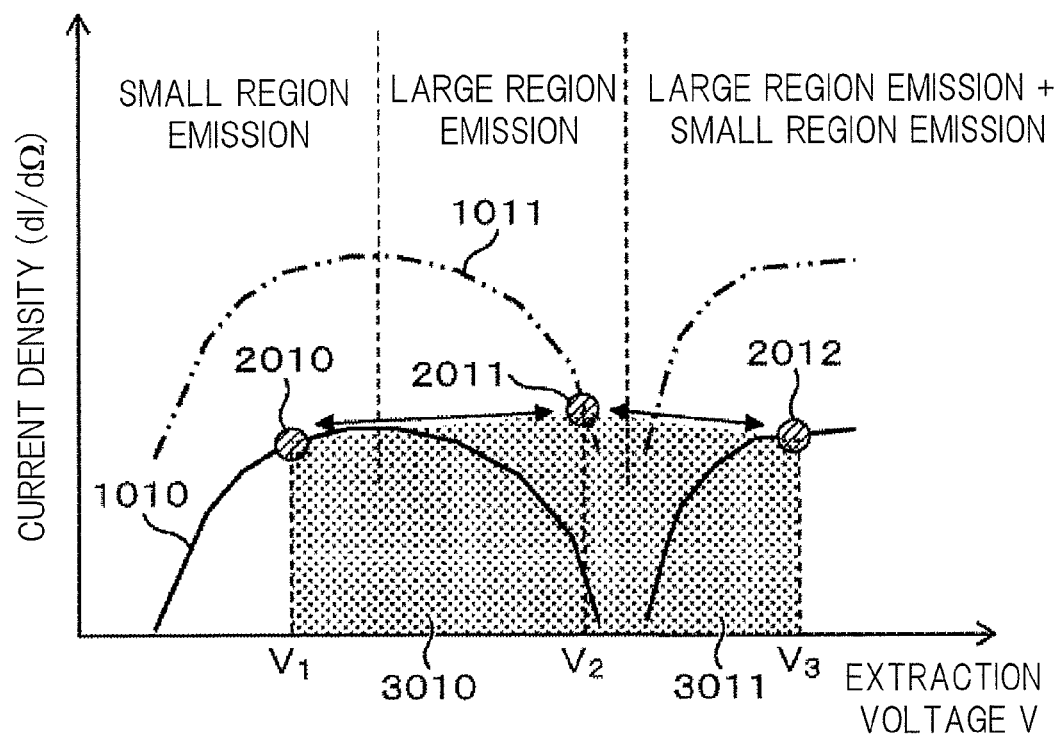
Figure 5B:
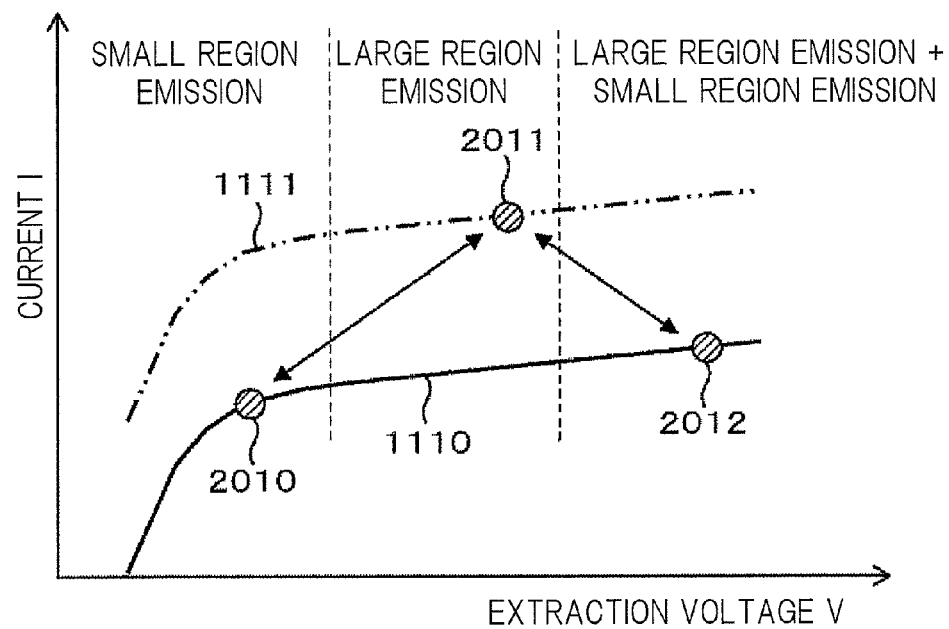
Figure 6:
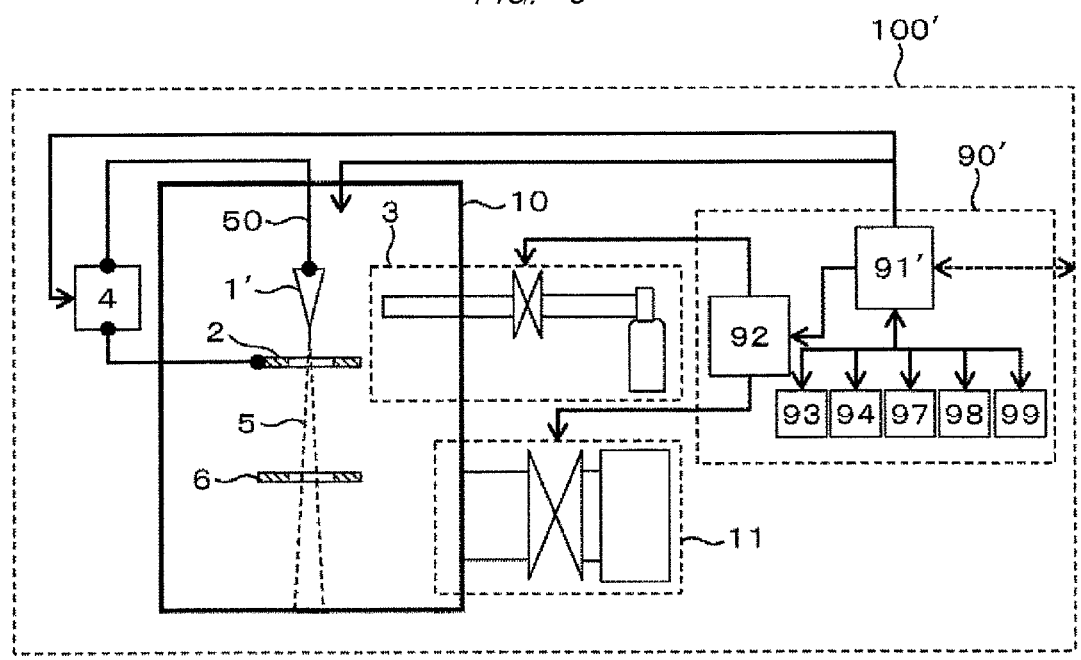
Figure 7:
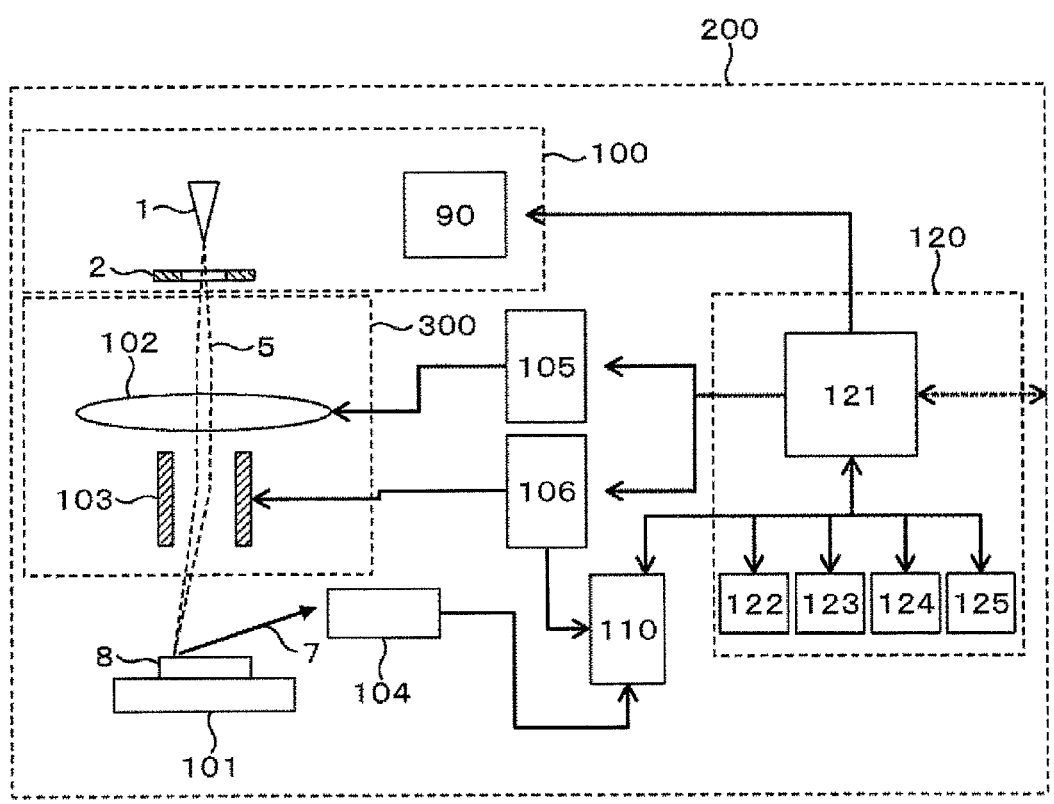

FIGS. 4A, 4B, 4C and 4D are views that show changes in an ion emission region in a gas field ionization ion source in accordance with embodiment 2, FIG. 4A showing a state of a small region emission of Ar ions, FIG. 4B showing a state of a large region emission of Ar ions, FIG. 4C showing a changed state of the large region emission of the large region emission of Ar ions, and FIG. 4D showing a state in which a small region emission of He ions and a large region emission of Ar ions simultaneously took place;

FIG. 5A is a current/voltage characteristic diagram showing a switching of operation modes in a gas field ionization ion source in accordance with embodiment 2, representing an ion emission current per unit region (current density) of an emitter electrode relative to an extraction voltage, which corresponds to the density of a current;

FIG. 5B is a current/voltage characteristic diagram showing a switching of operation modes in a gas field ionization ion source in accordance with embodiment 2, representing an ion emission current from the entire apex of the emitter electrode relative to an extraction voltage;

FIG. 6 is an entire block diagram of a gas field ionization ion source in accordance with embodiment 3; and FIG. 7 is an entire block diagram of a scanning ion microscope in accordance with embodiment 4.

DETAILED DESCRIPTION

First, referring to drawings, the following description will explain basic concepts of the present invention.

Small Region Emission and Large Region Emission

Figure 1A:
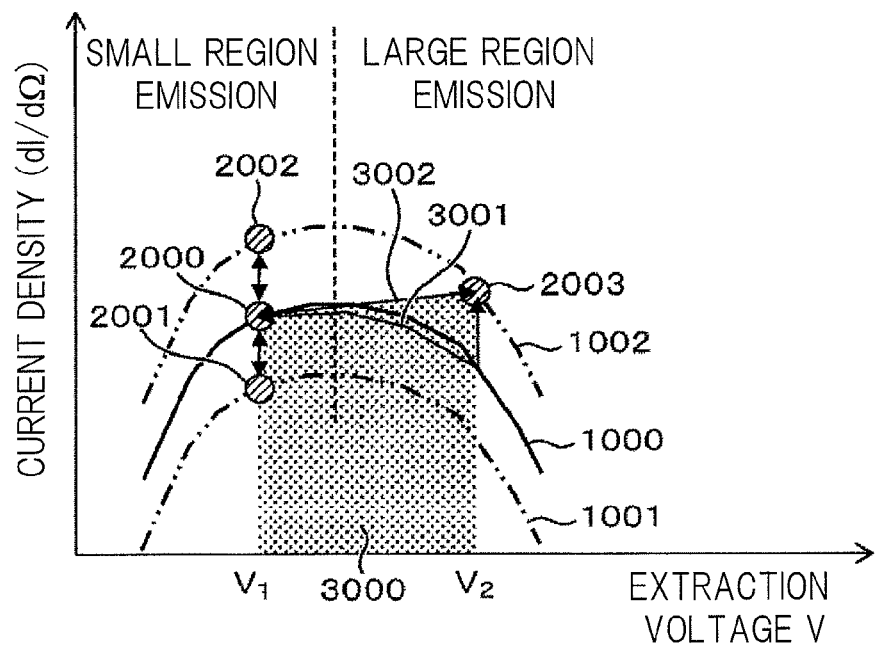
FIG. 1A is a current/voltage characteristic diagram showing a switching of operation modes in a gas field ionization ion source of the present invention, representing an ion emission current per unit region (current density) of an emitter electrode relative to an extraction voltage.
Figure 1B:
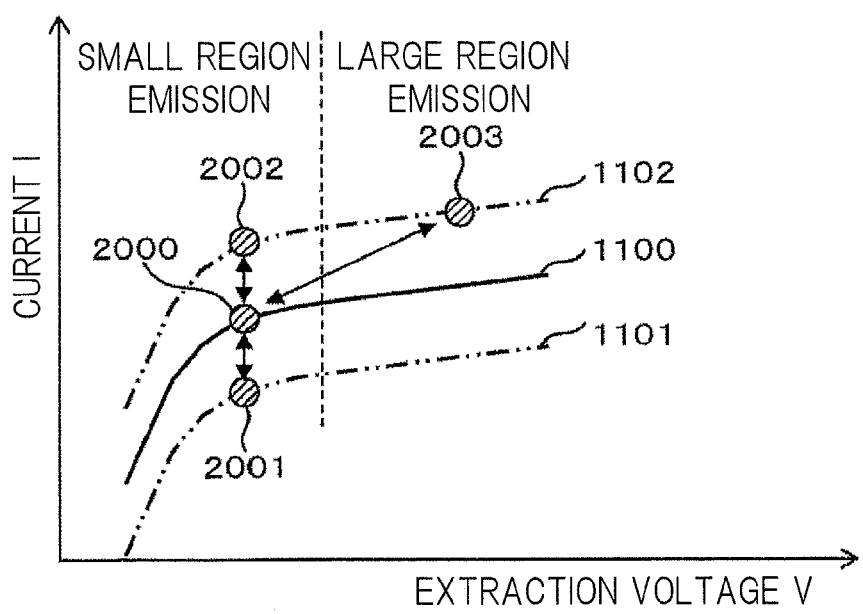
FIG. 1B is a current/voltage characteristic diagram showing a switching of operation modes in a gas field ionization ion source of the present invention, representing anion emission current from the entire apex of the emitter electrode relative to an extraction voltage.

First, referring to FIG. 1, the following description will explain a relationship between an extraction voltage and an ion current. FIG. 1 shows a current/voltage characteristic diagram (graph schematically displayed in double logarithm) showing a switching of operation modes in a gas field ionization ion source. In FIG. 1A, an extraction voltage to be applied between an emitter electrode and an extraction electrode is plotted on the axis of abscissas and the density of an ion emission current from the emitter electrode is plotted on the axis of ordinates. The density of an ion emission current refers to a value obtained by dividing the ion emission current by an area from which ions on the apex of the emitter electrode are emitted, which represents an ion emission current per unit area of the emitter electrode. In this case, a line 1000 represents a case in which a gas pressure in the vicinity of the emitter electrode is normally set. When the extraction voltage is increased, an ion emission occurs only from a limited small region for a while because a micro-protrusion is present on the apex of the emitter electrode. This operation state is referred to as a small region emission state. This small region is determined depending on the structure of the micro-protrusion, and typically represented by a single atom or a trimer. When the extraction voltage is further increased, the density of the ion current is brought into a state having a small increasing rate relative to the increased amount of the extraction voltage, that is, a so-called saturation level. This saturation level is determined by the gas pressure in the vicinity of the emitter electrode. Normally, the extraction voltage is used at an operation point 2000 immediately after the density of the ion current and the total current amount have entered saturation levels. In this case, the saturation level refers to a state in which, in FIG. 1B, as the extraction voltage is increased, the increasing rate of the total current amount becomes smaller relative to the increased amount of the extraction voltage (state indicated by a graph on a side having the extraction voltage V higher than that of the operation point 2000). By using the extraction voltage immediately after having entered the saturation level, the current density can be made higher, with the extraction voltage being kept as low as possible; therefore, it becomes possible to make the shape of the apex of the emitter electrode hardly damaged. When the extraction voltage is further increased from this point, an ion emission starts at a portion other than the small region, with the result that the density of the ion current starts to decrease. This operation state is referred to as "large region emission state". In FIG. 1B, the extraction voltage is plotted on the axis of abscissas and the ion emission current from the entire apex of the emitter electrode is plotted on the axis of ordinates. Even in the same gas pressure setting, a line 1100 is not lowered even in the case of a large region emission. When the extraction voltage is constant, the total ion emission current is determined by the gas pressure.

When the amount of ions emitted per unit region is accumulated over the region from which ions are emitted (hereinafter, referred to as "ion emission region"), the total ion emission current is obtained.

Micro-Protrusion Destruction Due to Gas Pressure Increase in Small Region Emission Next, referring to FIG. 1, the following description will explain a relationship between the pressure of an ionization gas supplied to the vicinity of the emitter electrode and an ion current. In the case when the gas pressure is constant, the current density and the total current amount are determined by the extraction voltage; however, when the gas pressure changes, these factors also change correspondingly. A line 1001 of FIG. 1A and a line 1101 of FIG. 1B show a state in which the gas pressure in the vicinity of the emitter electrode is lowered in comparison with a normal state. When the sequence proceeds from an operation point 2000 corresponding to the small region emission to an operation point 2001 having the same extraction voltage, the density of the ion emission current, and the total ion emission current are lowered.

Since the transitions between these operation points can be carried out reversibly, they are used for adjusting an ion beam current to be irradiated onto a sample through an ion optical system.

Next, a line 1002 of FIG. 1A and a line 1102 of FIG. 1B indicate states in which the gas pressure in the vicinity of the emitter electrode is increased in comparison with the normal state. When the sequence proceeds from the operation point 2000 corresponding to the small region emission to an operation point 2002 having the same extraction voltage, the density of the ion emission current and the total ion emission current are increased; however, the micro-protrusion on the apex of the emitter electrode is soon damaged to cause the ion emission to stop. The reason for this is explained as follows: When the gas pressure is raised, an impurity gas contained in the supply gas is easily adsorbed onto the emitter electrode so that the electric field evaporation probability of a material for the emitter electrode increases. Consequently, in a method for simply increasing the gas pressure, after the ion emission current has been increased, the apex structure of the emitter electrode needs to be regenerated each time, making it difficult to frequently change the amount of the ion beam current.

Function of Gas Pressure Increase in Large Region Emission

In the present invention, in order to increase the ion emission current, the gas pressure is increased after the large region emission state has been exerted by raising the extraction voltage. This process corresponds to a path for proceeding from the operation point 2000 to an operation point 2003 in FIG. 1A and FIG. 1B. By using this method, since the small region on the apex of the emitter electrode is not damaged, it becomes possible to reversibly change the ion emission current. In particular, even in the case when the gas pressure is raised to the same state (state indicated by lines 1002 and 1102) as or a state higher than the state in which the emitter electrode is easily damaged in the conventional method so as to increase the ion current, it is possible to reduce the probability of damaging the emitter electrode by using the method of the present invention. Therefore, even in the case when such an operation state with a large current is once exerted, it becomes possible to reduce the ion beam current without the necessity of thereafter regenerating the emitter electrode.

The reason for this can be explained by reference to FIG. 1A. In the operation point 2003, the current density of the emission ions is substantially the same as that of the normal operation point 2000. Moreover, the current density at the operation point 2003 is smaller than the current density at the operation point 2002 corresponding to a state where the emitter electrode is easily damaged. Most of the gas to be supplied to the vicinity of the emitter electrode is ionized on the periphery thereof and reduced before reaching the ion emission region at the apex of the emitter electrode. In the same manner as this, an impurity gas included in the gas to be supplied to the vicinity of the emitter electrode is also ionized on the periphery thereof and reduced before reaching the ion emission region at the apex of the emitter electrode. Therefore, the gas environment in the ion emission region at the apex of the emitter electrode, that is, in the vicinity of the micro-protrusion, is almost unchanged between the operation point 2000 and the operation point 2003 so that such a phenomenon as to damage the micro-protrusion in a short period of time does not occur. In other words, the probability of damaging the emitter electrode depends on a ratio between the gas pressure and the size of the ion emission region, that is, on the adsorbed gas amount that is consumed by the ionization per unit region of the ion emission region (or adsorbed gas amount supplied per unit region of the ion emission region), and in the method of the present invention, by controlling the extraction voltage that determines the size of the ion emission region in cooperation with the gas pressure, the probability of damaging the emitter electrode is reduced. As shown in the operation point 2003 of FIG. 1B, by increasing the gas pressure in the large region emission state, the total ion current can be increased, while reducing the probability of shortening the lifetime of the micro-protrusion of the emitter electrode.

Note that, in a transition between the operation point 2000 and the operation point 2003, it is essential to control the extraction voltage and the gas pressure so as not to increase the density of the ion emission current.

Referring to FIGS., the following description will explain embodiments of a gas field ionization ion source and an ion beam apparatus using the same of the present invention. In the following description, the ion beam apparatus includes, for example, an ion microscope, an ion beam machining observation device, a composite device of the ion beam machining observation device and the ion microscope, a composite device of the ion microscope and an electron microscope, and an analysis-inspection apparatus to which the ion microscope and the electron microscope are applied. It is needless to say that the invention is not intended to be limited by the above-mentioned devices as long as the corresponding apparatus is an ion beam apparatus using a gas field ionization ion source.

Embodiment 1

Basic Configuration and Basic Operation of Ion Source

Figure 2:
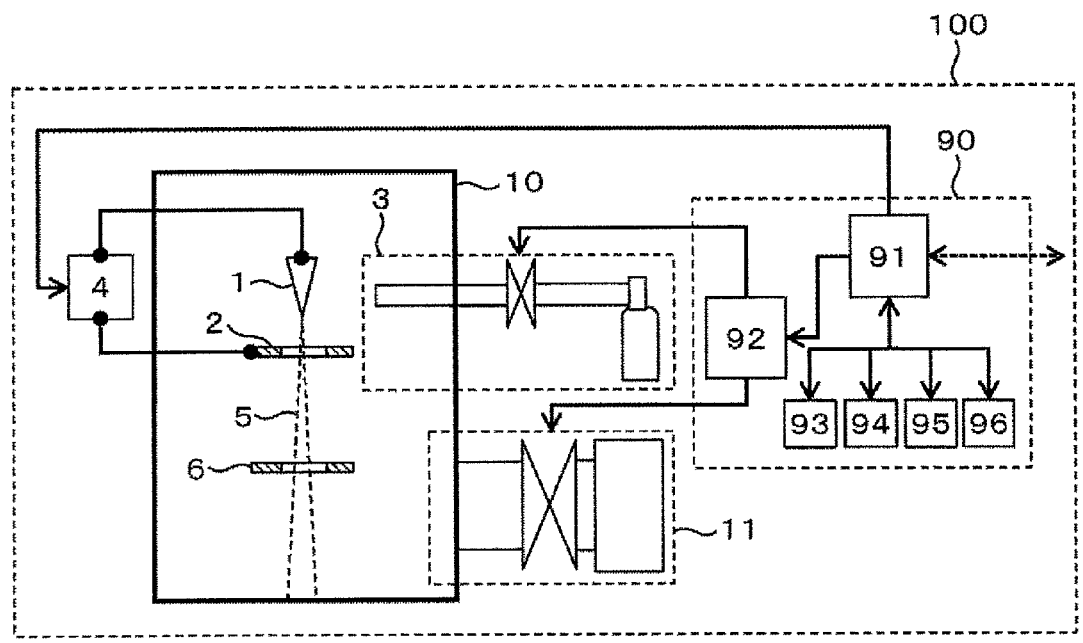
FIG. 2 is an entire block diagram of a gas field ionization ion source in accordance with embodiment 1.

FIG. 2 shows an entire block diagram showing a gas field ionization ion source in accordance with the present embodiment. Referring to FIG. 2, the following description will explain a basic configuration and basic operations of the ion source. The center portion of a gas field ionization ion source 100 is constituted by an emitter electrode 1 having a needle-shaped apex and an extraction electrode 2 having an opening in the center, which is disposed at a position spaced apart from the apex. These are held in a vacuum container 10. In the vicinity of the apex of the emitter electrode 1, a gas to be ionized is supplied. The pressure of this gas is adjusted by an operation balance between a gas supply system 3 and a gas exhaust system 11. The gas supply system 3 includes a gas source and a gas introduction pipe. The gas exhaust system 11 includes a vacuum pump and a gas exhaust pipe. Moreover, the operations of the gas supply system 3 and the gas exhaust system 11 are controlled by a gas pressure control unit 92. When a high voltage is applied, with the emitter electrode 1 side being a positive side, between the emitter electrode 1 and the extraction electrode 2 by an extraction voltage applying unit 4, a gas ionization takes place above a certain threshold value or more so that an ion beam 5 is emitted from the apex of the emitter electrode 1. In the case when the expansion of the ion beam 5 is large, one portion of the ion beam 5 on the outside is limited in its passage by an ion source aperture 6 having an opening in its center. An ion source control system 90 controls the entire ion source including the extraction voltage applying unit 4, the gas supply system 3 and the gas exhaust system 11, and also controls an input/output processes to and from the other apparatuses and the user. Note that, holding portions for the emitter electrode 1 and the extraction electrode 2, a vacuum exhaust portion, a cooling portion, a high voltage insulator portion and the like are unnecessary for the explanation; therefore, the descriptions thereof are omitted. The ion source control system 90 and the respective control units included therein may be constituted by exclusively-used circuit substrates as hardware, or may be constituted by programs that are executed by a computer connected to the ion beam apparatus.

State of Ion Emission

Figure 3A:
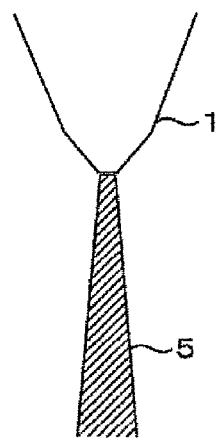
FIGS. 3A, 3B and 3C are views that show changes in an ion emission region in the gas field ionization ion source in accordance with embodiment 1, FIG. 3A showing a state of a small region emission, FIG. 3B showing a state of a large region emission, FIG. 3C showing a changed state of the large region emission.
Figure 3B:
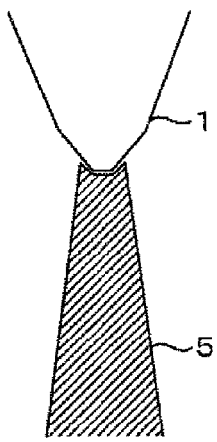
Figure 3C:
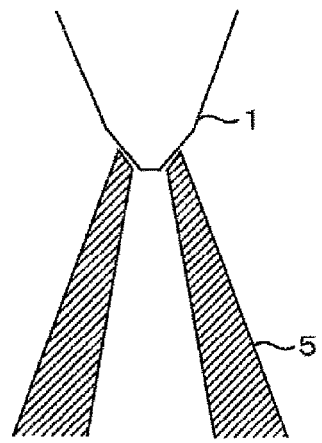

Next, the following description will explain a state in which the state of an ion emission is changed at the apex of the emitter electrode in accordance with the extraction voltage. As the emitter electrode 1 of the present embodiment, a base material of tungsten (W), molded into a needle shape, is coated with iridium (Ir), with a nano-pyramid structure having a pyramid shape being formed on its apex by annealing, and the resulting material is utilized. Moreover, as the gas to be ionized, neon (Ne) is used. The utmost apex of the emitter electrode 1 is a single atom (Single Atom). FIGS. 3A to 3C are schematic views showing typical states of the ion emission from the emitter 1. As the extraction voltage is increased, the sequence proceeds from the state of FIG. 3A to the state of FIG. 3C through the states of FIG. 3B. FIG. 3A shows a small region emission state explained by reference to FIG. 1, and the ion emission region corresponds to a single atom. FIG. 3B shows one of large region emission states explained by reference to FIG. 1, and in this state, ions are emitted not only from the single atom at the apex, but also from peripheral atoms. FIG. 3C shows a large region emission state in the case when the extraction voltage is further increased, and in this state, ions are no longer emitted from the single atom portion at the apex. This is because the electric field in the center becomes too strong to fail to satisfy ionization conditions. In the present embodiment, the state shown in FIG. 3A and the state shown in FIG. 3B are utilized as the ion source.

Cooperation of Extraction Voltage and Gas Pressure

Next, the following description will explain a controlling process in which the extraction voltage and the gas pressure are controlled in cooperation with each other, which is one of characteristics of the present embodiment. In the ion source control system 90, a normal extraction voltage corresponding to the small region emission state of FIG. 3A and an extraction voltage that corresponds to the large region emission state of FIG. 3B and is higher than the extraction voltage in the state shown in FIG. 3A are stored in the memory 93. For example, in the case of the large region emission state of FIG. 3B, an emission region that is about ten times as large as the state shown in FIG. 3A is formed. As operation states of the gas pressure control unit 92 that controls the operation balance between the gas supply system 3 for determining a gas pressure in the vicinity of the apex of the emitter electrode 1 and the gas exhaust system 11, a state of a first gas pressure and a state of a second gas pressure higher than the first gas pressure are stored in the memory 94. Hereinafter, the first gas pressure is sometimes referred to as a normal gas pressure. For example, in the present embodiment, the second gas pressure is about ten times as high as the first gas pressure. In the memory 95 for the ion emission state, a combination of the normal extraction voltage and the normal gas pressure is stored as a normal mode. Moreover, as a large current mode, a combination of a high extraction voltage and a high gas pressure is stored therein. A sequence relating to a transition between the ion emission modes that are stored in the memory 95 is stored in a memory 96. In this case, when an instruction for an ion emission state is given to the ion source control system 90 from the user or another apparatus, a control system main body 91 carries out reading processes from the related memories 93 to 96, and appropriately control the extraction voltage applying unit 4, the gas supply system 3 and the gas exhaust system 11. The controlling processes of the gas supply system 3 and the gas exhaust system 11 are carried out through the gas pressure control unit 92.

Upon transition from the normal mode to the large current mode, a controlling process in which after the extraction voltage has been raised, the gas pressure is raised is carried out. In contrast, upon transition from the large current mode to the normal mode, after the gas pressure has been lowered, the extraction voltage is lowered.

The transition between the normal mode and the large current mode corresponds to a transition between the operation points 2000 and 2003 in FIG. 1A. In this case, the extraction voltage and the gas pressure are controlled in cooperation with each other so as to prevent the density of the ion emission current in the ion emission region at the apex of the emitter electrode 1 from being raised from the normal level. More specifically, the extraction voltage and the gas pressure are controlled in cooperation with each other so as to prevent the density of the ion emission current from exceeding the predetermined adsorbed gas amount (or the adsorbed gas amount supplied per unit region of the ion emission region) consumed by ionization per unit region in the ion emission region. Preferably, the extraction voltage and the gas pressure are controlled in cooperation with each other so as to set the current density to lower than the maximum current density at the gas pressure in the state of the operation point 2000. Basic rules are to change the voltage after first lowering the gas pressure when a transition is made from a high mode of the gas pressure, and to change the voltage first when a transition is made from a low mode of the gas pressure.

Referring to FIG. 1A, these rules are explained. A region 3000 is defined as a region on a graph surrounded by the operation point 2000 prior to the transition, the operation point 2003 serving as the transition end, and extraction voltage values $V_1$ and $V_2$ specified by these operation points. In accordance with the present embodiment, at least during a period in which the extraction voltage makes a transition from $V_1$ to $V_2$, the extraction voltage and the gas pressure are controlled so as to allow the operation state to make a transition by passing through only the inside the region 3000. In other words, at least during the period in which the extraction voltage makes a transition from $V_1$ to $V_2$, the extraction voltage and the gas pressure are controlled so as to allow the current density to become lower than each of the operation states located on a line segment connecting the operation point 2000 to the operation point 2003. More specifically, the transition may be made through a path indicated by arrow 3001 in FIG. 1A, or may be made through a path indicated by arrow 3002. The path of arrow 3001 represents a state in which the gas pressure is raised after raising the extraction voltage so that the transition is made from the operation point 2003 to the operation point 2000, or a state in which the extraction voltage is lowered after lowering the extraction voltage so that the transition is made from the operation point 2003 to the operation point 2000. The arrow 3002 represents a state in which the extraction voltage and the gas pressure are controlled in cooperation with each other. Note that, the path is not particularly limited by these.

The above-mentioned appropriate control process makes it possible to prevent the density of the ion emission current in the small region of the emitter electrode 1 from being raised from the normal level so that the probability of damaging the micro-protrusion of the emitter electrode 1 is reduced. By using the above-mentioned characteristic controlling process, it becomes possible to extract ions of a large current, while suppressing the probability of damaging a nano-pyramid structure including a micro-protrusion and a single atom at the apex of the emitter electrode 1. By applying this ion source to an ion beam apparatus such as a scanning ion microscope or the like, it is possible to adjust an ion current in reflection ion analysis or the like, and consequently to obtain a signal with a high SNR.

Note that, for convenience of explanation, the large current mode and the normal mode have been exemplified; however, any modes may be used as long as two states in which ion beam current values are made different from each other are prepared, and the above-mentioned large current mode may be defined as a normal mode, and the above-mentioned normal mode may be defined as a small current mode. Moreover, although only the two modes are explained, the number of the modes is not limited by two, and step-by-step modes may be prepared in accordance with the ion beam current amount.

Material for Limitation Aperture

Next, the following description will explain a material for an ion source aperture as a further characteristic of the present embodiment. In the present embodiment, the material for the ion source aperture 6 is made substantially the same as the material for the surface of the emitter electrode 1. More specifically, Ir is used as the material for the ion source aperture 6. When an ion beam of a large current is extracted as in the case of the present embodiment, the opening angle of the ion beam 5 becomes larger so that the hitting probability onto the ion source aperture 6 becomes higher. In the case when ions are irradiated onto the ion source aperture 6, sputtering occurs although the amount thereof is slight, and the material particles of the ion source aperture 6 that have been sputtered scatter also in the direction of the emitter electrode 1. In the long term view point, this causes the apex configuration of the emitter electrode 1 to be deformed, with the result that the ion emission might become instable. In the present embodiment, since the ion source aperture is made of Ir, the sputtered particles that fall onto the emitter electrode 1 are Ir particles. The surface of the emitter electrode 1 is originally made of Ir; therefore, even if excessive Ir adheres thereto, a nano-pyramid structure that is the same as the original structure can be regenerated by carrying out an appropriate annealing process thereon. Thus, it is possible to obtain a further effect capable of suppressing instability of the ion emission caused by the sputtered ion source aperture.

Supplementary Item

Note that, in the above explanation, it is decided that the state of FIG. 3C should not be adopted because a high aberration is caused when the ion beam 5 from the gas field ionization ion source 100 is focused by an ion optical system or the like connected as the succeeding stage. However, since the virtual source (virtual light source) in this state is not necessarily large, this state may be used so as to obtain a further large current, as long as the allowable degree of the ion optical system to be used is high. The virtual source (virtual light source) refers to a portion that becomes narrowest when a group of orbits of emitted ions from the emitter surface are extended in the opposite direction, and is smaller than the area of the emitter surface. Normally, the smallest beam diameter can be obtained when an optical system makes the virtual light source projected on a sample by using a lens. Moreover, the fact that the allowable degree of the ion optical system is high refers to a state in which since the outer axis aberration such as spherical aberration or the like is small, even when an ion beam having a wide opening angle is made incident thereon, the resulting influences do not appear on the ion beam diameter on a sample. In other words, this case refers to a state in which the size and color aberration of the virtual light source form main causes that determine the beam diameter.

Moreover, in the above explanation, although Ne is used as the gas to be ionized, gases other than this may be used. In this case, however, in the case when helium (He) having a higher ionization electric field than that of Ne, it becomes difficult to realize the states shown in FIG. 3B and FIG. 3C except that the system is operated under an extremely low temperature. Since this case causes electric field evaporation regardless of the gas pressure, the apex of the emitter electrode is broken. Therefore, in order to obtain the effect characterized by the present embodiment, in the case of using a single gas, a gas, such as argon (Ar), krypton (Kr), hydrogen ($H_2$) or the like, which is a gas having a lower ionization electric field than that of Ne, is preferably used. However, in the case when the system is operated under an extremely low temperature, since the state up to that of FIG. 3B can be realized even when helium (He) is used, the present invention can be applied.

Embodiment 2

Basic Configuration and Basic Operation of Ion Source

In the present embodiment, a gas field ionization ion source in which a plurality of kinds of mixed gases are used as gases to be ionized will be explained. In particular, a plurality of kinds of gases having different extraction voltages capable of causing ionization are mixed to form an ionization gas. More specifically, a mixed gas of Ar and He is used as a gas to be ionized. Note that, the entire configuration of the gas field ionization ion source is basically the same as that of the first embodiment shown in FIG. 2. In the following description, with respect to portions that are the same as those of embodiment 1, explanations thereof will be omitted.

State of Ion Emission

FIG. 4 is a schematic view showing various ion emission states in the present embodiment. FIG. 4 corresponds to FIG. 3 of embodiment 1. Referring to FIG. 4, the following description will explain cases in which the state of the ion emission at the apex of the emitter electrode changes in response to the extraction voltage. As the extraction voltage is increased, the sequence proceeds in the order of states A, B, C and D of FIG. 4. The state shown in FIG. 4A is a small region emission state of Ar ions. The state shown in FIG. 4B is a large region emission state of Ar ions, with a weak emission being exerted from the apex of the emitter tip serving as the ion emission region in the state of FIG. 4A. The state shown in FIG. 4C is a large region emission state of Ar ions; however, no emission is exerted from the apex of the emitter tip serving as the ion emission region in the state of FIG. 4A. The state shown in FIG. 4D is a state in which a small region emission state of He ions and a large region emission state of Ir ions are simultaneously exerted. In this state, blocking Ar ions emitted from the periphery of the apex of the emitter tip by using the ion source aperture 6, it is possible to extract only He ions as a beam.

Cooperation of Extraction Voltage and Gas Pressure

Next, the following description will explain a controlling process in which the extraction voltage and the gas pressure are controlled in cooperation with each other in the present embodiment.

In the present embodiment, three operation states are memorized. These are respectively referred to as an Ar normal mode, an Ar large current mode and a He normal mode. As extraction voltage settings, three kinds of modes, that is, "normal", "middle" and "high" modes are memorized, and as gas pressure settings, two kinds of modes, that is, "normal" and "high" modes are memorized. FIG. 5 shows a current-voltage characteristic drawing indicating these three operation modes. These correspond to FIG. 1 of embodiment 1.

An operation point 2010 of FIG. 5 shows the Ar normal mode. This mode corresponds to a state in which the extraction voltage is set to "normal" and the gas pressure is set to "normal". The state of the ion emission is indicated by FIG. 4A. An operation point 2011 of FIG. 5 shows the Ar large current mode. This mode corresponds to a state in which the extraction voltage is set to "middle" and the gas pressure is set to "high". The state of the ion emission is indicated by FIG. 4B. An operation point 2012 of FIG. 5 shows the He normal mode. This mode corresponds to a state in which the extraction voltage is set to "high" and the gas pressure is set to "normal". When these operation states are compared with one another in FIG. 5A, it is found that in any of the states, the density of ion current at the apex of the micro-protrusion serving as the ion emission region is prevented from increasing so as to prevent the damage of the micro-protrusion. On the other hand, when these operation states are compared with one another in FIG. 5B, it is found that only in the case of the operation point 2011, that is, the Ar large current mode, a large ion current is obtained.

The transitions among the respective modes correspond to transitions among the respective operation points 2010, 2011 and 2012 in FIG. 5A. Note that, a transition may be directly made from the state of 2010 to the state of 2012 without passing through the state of 2011. In this case, the extraction voltage and the gas pressure are controlled in cooperation with each other so as to prevent the density of the ion emission current in the ion emission region at the apex of the emitter electrode 1 from becoming higher than the normal level. More specifically, in a manner so as to prevent the density of the ion emission current from exceeding the predetermined adsorption gas amount to be consumed by ionization per unit region of the ion emission region (or the adsorption gas amount supplied per unit region of the ion emission region), the extraction voltage and the gas pressure are controlled in cooperation with each other. Preferably, the extraction voltage and the gas pressure can be controlled in cooperation with each other so as to make the density thereof not more than the maximum current density at the gas pressure in the state of the operation point 2010. Basic rules are explained as follows: in the case when a transition is made from a high mode of the gas pressure, after first lowering the gas pressure, the voltage is changed, and in the case when a transition is made from a low mode of the gas pressure, the voltage is first changed.

Referring to FIG. 5A, these rules are explained. First, the transition from the state of 2010 to the state of 2011 will be explained. A region 3010 is defined as a region on a graph surrounded by the operation point 2010 prior to a transition, the operation point 2011 serving as the transition end, and extraction voltage values $V_1$ and $V_2$ specified by these operation points. In accordance with the present embodiment, at least during a period in which the extraction voltage makes a transition from $V_1$ to $V_2$, the extraction voltage and the gas pressure are controlled so as to allow the operation states to make a transition by passing through only the inside the region 3010. In other words, at least during the period in which the extraction voltage makes a transition from $V_1$ to $V_2$, the extraction voltage and the gas pressure are controlled so as to allow the current density to become lower than each of the operation states located on a line segment connecting the operation point 2010 to the operation point 2011. The same is true for the transition from the state of 2011 to the state of 2010.

Next, the transition from the state of 2011 to the state of 2012 will be explained. A region 3011 is defined as a region on a graph surrounded by the operation point 2011 prior to the transition, the operation point 2012 serving as the transition end, and extraction voltage values $V_2$ and $V_3$ specified by these operation points. In accordance with the present embodiment, at least during a period in which the extraction voltage makes a transition from $V_1$ to $V_2$, the extraction voltage and the gas pressure are controlled so as to allow the operation state to make a transition by passing through only the inside the region 3011. In other words, at least during the period in which the extraction voltage makes a transition from $V_2$ to $V_3$, the extraction voltage and the gas pressure are controlled so as to allow the current density to become lower than each of the operation states located on a line segment connecting the operation point 2011 to the operation point 2012. The same is true for the transition from the state of 2012 to the state of 2011.

Next, the transition from the state of 2010 to the state of 2012 will be explained. In the same manner as in the above-mentioned example, in this case also, at least during a period in which the extraction voltage makes a transition from $V_1$ to $V_3$, the extraction voltage and the gas pressure are controlled so as to allow the operation state to make a transition by passing through only the inside of a region surrounded by the operation point 2010 prior to the transition, the operation point 2012 of the transition end and extraction voltages $V_1$ and $V_3$ specified by these operation points. In other words, at least during the period in which the extraction voltage makes a transition from $V_1$ to $V_3$, the extraction voltage and the gas pressure are controlled so as to allow the current density to become lower than each of the operation states located on a line segment connecting the operation point 2010 to the operation point 2012. Note that, in the case of the transition from the state of 2010 to the state of 2012, it has been found by the above-mentioned two examples that the transition inside the region 3010 and the region 3011 makes the emitter electrode hardly damaged; therefore, at least during the period in which the extraction voltage makes a transition from $V_1$ to $V_3$, the extraction voltage and the gas pressure may be controlled so as to allow the operation state to make a transition by passing through only the inside of the region 3010 and the region 3011. Note that, the same is true for the transition from the state of 2012 to the state of 2010.

Moreover, with respect to the above-mentioned transition, in the same manner as in embodiment 1, with respect to the paths inside the region 3010 and the region 3011, any path may be used. For example, after one of the extraction voltage and the gas pressure has been controlled, a transition may be made by controlling the other, or the extraction voltage and the gas pressure may be controlled in cooperation with each other.

By using the above-mentioned controlling processes, it becomes possible to extract ions having a large current, while suppressing the probability of damaging the micro-protrusion of the apex of the emitter electrode 1, that is, a nano-pyramid configuration including a single atom in the present embodiment. In particular, by using a mixed gas, it becomes possible to selectively utilize current values of a plurality of ion beams having different characteristics in a variably changed state. Since Ar ions are heavy as in the case of the present embodiment, these ions are suitable for use in machining, and when this ion source is used for an ion microscope, it becomes possible to carry out a high-speed machining process by adjusting the Ar ion current, and it also becomes possible to observe a micro-region by using He ions; therefore, the ion beam apparatus can be operated by switching modes between a machining mode and an observation mode.

Note that, for convenience of explanation, the Ar normal mode, Ar large current mode and He normal mode are exemplified and discussed; however, any modes may be used as long as a plurality of states having different ion beam current values can be prepared, and the above-mentioned Ar large current mode may be defined as an Ar normal mode, and the above-mentioned Ar normal mode and He normal mode may be defined as an Ar small current mode and an He small current mode. Further, although the explanation has been given by using only the three modes, the number of the modes is not necessarily limited by three, and step-by-step modes may be prepared in accordance with the ion beam current amount.

Supplementary Item

Moreover, in the above explanation, it is decided that the state of FIG. 4C should not be adopted because a high aberration is caused when the ion beam 5 from the gas field ionization ion source 100 is focused by an ion optical system or the like connected as the succeeding stage. However, since the virtual source (virtual light source) in this state is not necessarily large, this state may be used so as to obtain a further large current, as long as the allowable degree of the ion optical system to be used is high. Note that, the virtual source (virtual light source) and the allowable degree of the ion optical system have the same meanings as those shown in embodiment 1.

Embodiment 3

Basic Configuration and Basic Operation of Ion Source

FIG. 6 shows an entire configuration of a gas field ionization ion source in accordance with the present embodiment. The basic configuration and basic operation are the same as those of the first embodiment shown in FIG. 2; however, the point that the apex of an emitter electrode 1' is made of a trimer and the point that an ion source control system 90' also controls the emitter driving system 50 are different therefrom. The detailed description will be given later. In the following description, explanations of those portions that are the same as those of embodiment 1 will be omitted.

State of Ion Emission

As the emitter electrode 1' of the present embodiment, a material, which uses tungsten (W) formed into a needle shape as a base material, with its apex being formed into a predetermined shape, is utilized. The following description will briefly explain a sequence of forming processes of the W needle. First, after etching the periphery of the apex by applying an electric field thereto in oxygen ($O_2$) so as to be sharpened, the apex is gradually peeled off by electric field evaporation, by applying an electric field thereto in vacuum or in a rare gas. The forming process is finished when the apex has an appropriate curvature, with its apex being made of a trimer. The typical state of an ion emission from this emitter 1' is basically the same as that shown by FIG. 3A to FIG. 3C. Only the point of difference is that in the small region emission state shown in FIG. 3A, the ion emission region is made of not a single atom, but a trimer. In the case when the ion emission from this ion source is utilized in an ion optical system to be connected to the succeeding stage, the adjustment of the center axis of the ion emission region (trimer) to the axis of the ion optical system is not carried out. Since each of the ion emission regions of the trimer is completely separated from one another in the small region emission state, the center of the emitter corresponds to a portion with no ion emission, and when the aperture in the ion optical system is made narrower, no ion beam has come to arrive on a sample. Therefore, normally, the direction of the emitter electrode 1' is altered so as to adjust the emission of one atom of the trimer to the axis of the ion optical system. Note that, the alteration of the direction is carried out by a combination of movements of a gimbal mechanism, and a horizontal micro movement mechanism, not shown. On the other hand, in the large region emission state, ion emission regions from a plurality of atoms are overlapped with one another. In order to widen the aperture of the ion optical system so as to deliver as much electric current as possible onto a sample, it is preferable to make the center axis of the emitter coincident with the center axis of the ion optical system.

Cooperation of Extraction Voltage, Gas Pressure and Direction

Next, the following description will explain a process in which controls of the extraction voltage and the gas pressure as well as the direction of the emitter electrode are carried out in cooperation with one other, which is one of characteristics of the present embodiment. In an ion source control system 90', a normal extraction voltage corresponding to the small region emission state of FIG. 3A and an extraction voltage that corresponds to the large region emission state of FIG. 3B and is higher than the extraction voltage in the state shown in FIG. 3A are stored in the memory 93. For example, in the present embodiment, in the case of the large region emission state of FIG. 3B, an emission region that is about ten times as large as the state shown in FIG. 3A is formed. As operation states of the gas pressure control unit 92 that controls the operation balance between the gas supply system 3 for determining a gas pressure in the vicinity of the apex of the emitter electrode 1' and the gas exhaust system 11, a state of a first gas pressure and a state of a second gas pressure higher than the first gas pressure are stored in the memory 94. Hereinafter, the first gas pressure is sometimes referred to as a normal gas pressure. For example, in the present embodiment, the second gas pressure is about ten times as high as the first gas pressure. As operation states of the emitter driving system 50 for determining the direction of the emitter electrode 1', a state with an inclination set in accordance with one atom of the apex trimer of the emitter electrode 1' and a state with no inclination set in accordance with the center axis of the apex of the emitter electrode 1' are stored in a memory 97. In a memory 98 for the ion emission state, combinations of a normal extraction voltage and a normal gas pressure as a normal mode and the direction at the time of inclination are stored as a normal mode. Moreover, combinations of a high extraction voltage and a high gas pressure as a large current mode and the direction at the time of no inclination are stored therein as a large current mode. The sequence relating to transitions between the ion emission states to be stored in the memory 98 is stored in a memory 99. Here, when a specification for the ion emission state is given from the user or another apparatus to the ion source control system 90', a control system main unit 91' carries out a reading process on the related memories 93 to 99 so that appropriate controlling processes are carried out on the extraction voltage applying unit 4, the gas supply system 3, the gas exhaust system 11 and the emitter driving system 50. The controlling processes of the gas supply system 3 and the gas exhaust system 11 are carried out through the gas pressure control unit 92.

In the same manner as in the case of the first embodiment, upon transition from the normal mode to the large current mode, a controlling process is carried out so that after the extraction voltage has been raised, the gas pressure is raised. In contrast, upon transition from the large current mode to the normal mode, after the gas pressure has been lowered, the extraction voltage is lowered. The transition between the normal mode and the large current mode corresponds to the transition between the operation points 2000 and 2003 in FIG. 1A. In this case, the extraction voltage and the gas pressure are controlled in cooperation with each other so as to prevent the density of the ion emission current in the ion emission region at the apex of the emitter electrode 1' from being raised from the normal level. More specifically, the density of the ion emission current is predetermined. The extraction voltage and the gas pressure are controlled in cooperation with each other so as to prevent the density of the ion emission current from exceeding the predetermined adsorbed gas amount per unit region in the ion emission region. Preferably, the extraction voltage and the gas pressure are controlled in cooperation with each other so as to set the current density to lower than the maximum current density at the gas pressure in the state of the operation point 2000. Basic rules are explained as follows: When a transition is made from a high mode of the gas pressure, after first lowering the gas pressure, the voltage is changed, and when a transition is made from a low mode of the gas pressure, the voltage is first changed. With respect to the above-mentioned cooperative operations between the extraction voltage and the gas pressure, the same processes as those in embodiment 1 are carried out. In addition to those of embodiment 1, the present embodiment also controls the direction of the emitter tip in cooperation with these. With this configuration, the job for adjusting the direction of the emitter tip so as to optimize to the micro beam in the case of the small region emission state and also to optimize to the large current beam in the case of the large region emission state can be easily carried out by simply using the mode setting of the operation state of the ion source.

By using these appropriate controlling processes, since the density of the ion emission current in the small region of the emitter electrode 1' is prevented from becoming higher than the normal level, it is possible to reduce the probability of damaging the micro-protrusion of the emitter electrode 1'.

Moreover, it becomes possible to extract ions having a large current, while suppressing the probability of damaging the micro-protrusion including the apex trimer of the emitter electrode 1'. Furthermore, in the normal mode, the ion emission from one atom of the trimer is automatically selected. By using this ion source for an ion beam apparatus such as a scanning ion microscope or the like, it becomes possible to adjust an ion current in a reflection ion analysis or the like, and consequently to obtain a signal with a high SNR.

Note that, for convenience of explanation, the large current mode and the normal mode are exemplified and discussed; however, any modes may be used as long as two states having different ion beam current values can be prepared, and the above-mentioned large current mode may be defined as a normal mode, and the above-mentioned normal mode may be defined as a small current mode. Further, although the explanation has been given by using only the two modes, the number of the modes is not necessarily limited by two, and modes may be prepared step by step in accordance with the ion beam current amount.

Supplementary Item

Moreover, in the present embodiment, the direction of the emitter electrode 1' is set to be non-inclined; however, this may be used with being kept in the inclined state. In this case, since the current center of the ion beam 5 is inclined, it is necessary to pay attention to the occurrence of aberration in an ion optical system to be installed in the succeeding stage of the ion source.

Embodiment 4

Basic Configuration and Basic Operation of Ion Microscope

FIG. 7 shows an entire block diagram of a scanning ion microscope in accordance with the present embodiment. The basic configuration of a scanning ion microscope 200 is the same as that of a focused ion beam (FIB) apparatus with a maximum acceleration voltage of 40 kV produced for a gallium liquid metal ion source (Ga-LMIS), with the ion source unit being replaced by the gas field ionization ion source 100 shown in the first embodiment. Note that, of the gas field ionization ion source 100, portions that are not required for explanation are omitted from showing by the drawings. In the following description, the explanations of the same portions as those of embodiment 1 will be omitted.

In the scanning ion microscope 200, an ion beam 5 of Ne emitted from the gas field ionization ion source 100 is made incident on an ion optical system 300. The ion beam 5 that is accelerated, focused and deflected by this ion optical system 300 is irradiated onto a sample 8 mounted on a sample stage 101. Secondary electrons 7 generated from the sample 8 by the irradiation of the ion beam 5 are detected by a secondary electron detector 104. Moreover, although not shown in the drawings, a back scattered ion detector for detecting back scattered ions may be installed. Particles that reflect the state of the sample, and are obtained by the irradiation of the ion beam, such as secondary electrons, back scattered ions or the like, are referred to collectively as secondary particles. Note that, the passage region of the ion beam 5 is basically vacuum exhausted.

Of the ion optical system 300, portions relating to the acceleration, focusing and optical-axis adjustment and the limitation of the opening angle of the ion beam 5 are driven by a lens system driving unit 105. Moreover, of the ion optical system 300, portions relating to the deflection and scanning of the ion beam 5 on the sample are driven by a deflection system driving unit 106. The image processing unit 110 forms a secondary electron observation image by making an intensity signal of secondary electrons 7 from the secondary electron detector 104 and a scanning signal of the deflection system driving unit 106 in correspondingly association with each other.

A microscope control system 120 controls the entire scanning ion microscope 200 including the ion source control system 90, the lens system driving unit 105, the defection system driving unit 106 and the image processing unit 110, and also controls an input/output from another apparatus or the user. For example, the microscope control system 120 reads out a secondary electron observation image from the image processing unit 110, and display the resulting image on a screen, not shown. The microscope control system 120 controls the deflection system driving unit 106 so as to irradiate the ion beam 5 onto a position on the screen specified by the user.

Cooperation Between Ion Source Operation Mode and Optical Condition

In the microscope control system 120, a plurality of ion emission states to be outputted to the ion source control system 90 are stored in a memory 122. A plurality of focusing states to be specified to the lens driving unit are stored in a memory 123. Beam states represented by combinations between the ion emission state and the focusing states are stored in a memory 124. The sequence relating to transitions between the beam states stored in the memory 124 is stored in a memory 125. Here, when a specification as to the beam state is given to the microscope control system 120 from the user or another apparatus, the microscope control system main unit 121 carries out a reading process on the related memories 122 to 125 so as to appropriately control the ion source control system 90 and the lens system driving unit 105.

For example, in the case when a sample 8 is observed with high resolution, the ion source is operated at a normal gas pressure in the small region emission state, and in the ion optical system, the opening angle of the ion beam 5 is limited by the minimum aperture.

Moreover, in the case when the back scattered ions from the sample 8 are detected (by a back scattered ion detector not shown) with a high SNR, since the current of the ion beam 5 needs to be increased, the ion source is switched to the large region emission state, and operated with an increased gas pressure, and in the ion optical system, the maximum apreture is set so as to alleviate the limitation of the opening angle of the ion beam 5. In the case when the ion source is set in the large region emission state, since the extraction voltage is changed, with the position of the virtual source (virtual light source) being also changed, the operation conditions of the lens system inside the ion optical system 300 need to be also changed. Moreover, depending on the requirements of an analysis, it is supposed that the acceleration voltage be simultaneously lowered, and in this case, the adjustment conditions of the ion optical axis need to be altered in cooperation therewith. Furthermore, depending on the requirements of an analysis, it is supposed that the current density distribution of the ion beam 5 on the sample 8 be made uniform, and in this case, the focusing condition needs to be set not to a normal focusing condition in which the virtual source of the ion source is projected onto the sample 8, but to a focusing condition in which any one of images of the limitation apertures in the ion optical system 300 is projected onto the sample 8. In summary, the microscope control system 120 of the present embodiment is designed such that in accordance with the operation state of the ion source that is determined by the gas pressure and the extraction voltage, the operation condition of the ion optical system is switched. When indicated by using another expression, the operation condition of the ion optical system is controlled so as to maximize the ion beam current on the sample in cooperation with the switching of the operation state of the ion source.

According to the present embodiment, it is possible to freely change the current of the ion beam 5, the beam diameter and the like, in accordance with the necessity of the high resolution observation, high SNR analysis and the like, without causing damage in the micro-protrusion of the apex of the emitter electrode 1. Further, although the operation conditions of the ion optical system include parameters that relate to one another in a complicated manner, it becomes possible to switch these, while being kept appropriately in cooperation with one another, and consequently to improve the operability upon switching the operation states of the ion source.

Supplementary Item

In the scanning ion microscope of the present embodiment, the microscope control system 120 is designed so as to carry out the control of the ion source and the control of the ion optical system in cooperation with each other. The functions of the microscope control system 120 may be further expanded so as to control alternations of settings of the secondary electron detector and other detectors, not shown, and other functions in cooperation with one another.

Moreover, in the scanning ion microscope of the present embodiment, Ne is used as a gas to be ionized; however, when a heavy gas, such as Kr or the like, is used, an ion beam suitable for machining can be formed. Since the present embodiment can freely change the current, the beam diameter or the like of ion beam, if necessary, it is possible to use as a machining observation apparatus in place of a machining apparatus using a liquid metal ion source, such as Ga-FIB or the like.

<Supplementary Item as a Whole>

In the gas field ionization ion source as described above, such an emitter electrode in which the ion emission state makes a transition from A to C of FIG. 3 or FIG. 4 through B thereof in accordance with the increase of the extraction voltage is used. Moreover, the states of A and B are mainly utilized. However, in the case of an emitter electrode having an abrupt shape on the outside of the ion emission region (single atom or trimer) at the apex, in some cases, no state of B exists. As described earlier, the state of C is not necessarily used completely, the emitter electrode having the state of B is more preferably used. The reason for this is because a portion having less aberration in the ion optical system can be mainly used so that the focusing property can be maintained in a high level even in the case of an ion beam having a large current.

Explanation of Reference Numerals 1, 1' Emitter electrode
2 Extraction electrode
3 Gas supply system
4 Extraction voltage applying unit
5 Ion beam
6 Ion source aperture
7 Secondary electron
8 Sample
10 Vacuum container
11 Gas exhaust system
90, 90' Ion source control system
91, 91' Control system main body unit
92 Gas pressure control unit
100, 100' Gas field ionization ion source
101 Sample stage
102 Lens system
103 Deflection system
104 Secondary electron detector
105 Lens system driving unit
106 Deflection system driving unit
110 Image processing unit
120 Microscope control system
121 Microscope control system main body unit
200 Scanning ion microscope
300 Ion optics

What is claimed is:

1. An ion beam apparatus comprising:
a gas field ionization ion source for generating an ion beam;
a sample stage for holding a sample;
a lens system that focuses the ion beam emitted from the gas field ionization ion source so as to be irradiated onto the sample;
a deflection system that deflects the ions so as to change the irradiation position of the ion beam on the sample;
a secondary particle detector for detecting secondary particles emitted from the sample;
an image processing unit for forming an observation image of the sample by using the detection results of the secondary particle detector; and
a control unit for controlling the lens system and the deflection system so as to adjust the irradiation position of the ion beam,
wherein the gas field ionization ion source comprises:
an emitter electrode having a needle-shaped apex provided with a micro-protrusion having a single atom or a trimer at the apex thereof;
an extraction electrode having an opening at a position spaced apart in an apex direction from the emitter electrode;
a gas supply unit for supplying a gas to the vicinity of the apex of the emitter electrode;
a gas pressure control unit for controlling the pressure of the gas;
an extraction voltage applying unit for forming an electric field to ionize the gas in the vicinity of the apex of the emitter electrode by applying an extraction voltage between the emitter electrode and the extraction electrode; and
an ion source control unit that controls so as to emit an ion beam at least in two operation states including a first operation state in which, when a first extraction voltage is applied, with the gas pressure being set to a first gas pressure, ions are emitted from a first ion emission region at the apex of the emitter electrode, and a second operation state in which, when a second extraction voltage that is higher than the first extraction voltage is applied, with the gas pressure being set to a second gas pressure that is higher than the first gas pressure, ions are emitted from a second ion emission region that is larger than the first ion emission region, with the ion beam being controlled so that the ion beam current on the sample in the second operation state is greater than the ion beam current on the sample in the first operation state.

2. The ion beam apparatus according to claim 1, wherein upon switching from the first operation state to the second operation state, after raising the extraction voltage, the gas pressure is raised.

3. The ion beam apparatus according to claim 1, wherein upon switching from the second operation state to the first operation state, after lowering the gas pressure, the extraction voltage is lowered.

4. The ion beam apparatus according to claim 1, wherein the micro-protrusion at the apex of the emitter electrode can be regenerated in the ion beam apparatus, and
an aperture for limiting one portion of ions that are emitted from the emitter electrode is installed, with the aperture being made of a material that is substantially the same as the material for the surface of the emitter electrode.

5. The ion beam apparatus according to claim 1, wherein the gas is a mixed gas mainly composed of two or more kinds of gases, and
a controlling process is performed so as to emit the ion beam in a third operation state in which, when a third extraction voltage that is higher than the second extraction voltage is applied, with the gas pressure being set to a third gas pressure that is smaller than the second gas pressure, ions are emitted from a third ion emission region that is lower than the second ion emission region.

6. The ion beam apparatus according to claim 1, further comprising:

an emitter driving unit for changing the direction of the emitter electrode, wherein upon switching operation states between the first operation state and the second operation state, the ion source control unit carries out a controlling process so as to change the direction of the emitter electrode.

* * * * *